United States Patent [19]

Cheng

[11] Patent Number: 5,801,929
[45] Date of Patent: Sep. 1, 1998

[54] CLIP-ON IC RETAINING APPARATUS

[76] Inventor: Kan Cheng, 40100 San Carlos Pl., Fremont, Calif. 94539

[21] Appl. No.: 740,987

[22] Filed: Nov. 5, 1996

[51] Int. Cl.$^6$ .................................................. H05K 7/02
[52] U.S. Cl. ........................... 361/807; 361/783; 361/809; 361/820; 439/72
[58] Field of Search ................. 174/52.4; 206/715, 206/716, 722, 724, 726, 727, 728, 718; 257/678, 718, 719, 726, 727; 361/704, 707, 710, 717, 718, 719, 720, 722, 760, 779, 783, 807, 809, 820; 439/68, 70, 72, 73, 330, 331, 366, 525, 526, 912

[56] References Cited

U.S. PATENT DOCUMENTS

| | | | |
|---|---|---|---|
| 3,874,768 | 4/1975 | Cutchaw | 439/331 |
| 4,381,131 | 4/1983 | Demianluk | 439/331 |
| 4,535,887 | 8/1985 | Egawa | 439/331 |
| 4,872,845 | 10/1989 | Korsunsky et al. | 439/70 |
| 4,936,783 | 6/1990 | Petersen | 439/70 |
| 5,015,946 | 5/1991 | Janko | 324/765 |
| 5,100,333 | 3/1992 | Suzuki | 439/73 |
| 5,226,824 | 7/1993 | Karlovich et al. | 439/70 |
| 5,301,416 | 4/1994 | Foerstel | 206/724 |
| 5,567,177 | 10/1996 | Foerstel et al. | 439/526 |

FOREIGN PATENT DOCUMENTS

| | | | |
|---|---|---|---|
| 1-81255 | 3/1989 | Japan | 438/369 |
| 4-184991 | 7/1992 | Japan | 361/807 |

*Primary Examiner*—Donald Sparks
*Attorney, Agent, or Firm*—Jack Lo

[57] ABSTRACT

Many circuit boards include conventional sockets for receiving optional ICs. Such sockets are soldered to the circuit board during the manufacturing process. However, many of such sockets are wasted because they are never used. Such waste can be eliminated by using a clip-on IC retaining apparatus. It includes a housing, a retaining clip, and four registration holes arranged at the corners of a trace pad on a circuit board. The housing includes a shallow, open cavity on a bottom side for receiving a SMD. Four registration fingers projecting from the bottom of the housing mate with the registration holes on the circuit board to align the pins of the SMD with the trace pad. Ribs on the walls of the cavity slide between the pins to separate and straighten any bent pins. The retaining clip includes four downwardly bent flat springs connected in a rectangular pattern. Four slots in the housing extend vertically between the top thereof and the bottom of the fingers. Hooks projecting from the corners of the clip are positioned through the slots. The tips of the hooks extend out the bottom of the fingers and engage the bottom rims of the registration holes. The clip-on IC retaining apparatus and the IC can be easily installed as necessary by a user anytime after the circuit board is manufactured.

6 Claims, 3 Drawing Sheets

CLIP-ON IC RETAINING APPARATUS

BACKGROUND OF THE INVENTION

1. Field of the Invention

This invention relates generally to sockets for mounting integrated circuits (ICs), specifically to a clip-on retaining apparatus for mounting an IC on a circuit board.

2. Prior Art

Some circuit boards include sockets for receiving optional ICs, so that they can be easily upgraded by a user. For example, many computer circuit boards have sockets for upgrade chips, such as processor and memory chips. Some ICs—know as through-hole mount devices—have downwardly projecting pins that are normally meant for being inserted through holes in a circuit board; other ICs—known as surface-mount devices (SMDs), have bent pins with a horizontal distal end that are positioned on top of a trace pad. Both types of ICs can be attached to a circuit board either by being soldered directly thereon, or inserted into a socket which is soldered on the circuit board. Different types of sockets are available for through-hole mount and SMDs.

All conventional sockets are soldered to the circuit board during the manufacturing process. Such sockets have a large number of metal contacts, which make the sockets relatively expensive to manufacture. The metal contacts also increase capacitance and inductance loads, which adversely affect the performance of the circuit. Furthermore, many such sockets are never used during the life of the product, so that they needlessly increase the cost of the circuit boards.

OBJECTS OF THE INVENTION

Accordingly an object of the present invention is to provide a clip-on IC retaining apparatus that retains an IC on a circuit board without solder.

Another object of the present invention is to provide a clip-on IC retaining apparatus that is easily installed by a user as necessary after the manufacturing process, so as to eliminate the need to manufacture circuit boards with empty sockets.

Another object of the present invention is to provide a clip-on IC retaining apparatus that includes no metal contacts, so that it does not increase capacitance or inductance loads.

Yet another object of the present invention is to provide a clip-on IC retaining apparatus which is less expensive to manufacture than prior art IC sockets.

Further objects of the present invention will become apparent from a consideration of the drawings and ensuing description.

BRIEF SUMMARY OF THE INVENTION

A clip-on IC retaining apparatus includes a circuit board with a trace pad for mating with the pins of a SMD. Four registration holes in the circuit board are arranged at the corners of the trace pad. To install, a SMD is positioned on the trace pad, and a rigid rectangular housing with a cavity on its lower side is positioned over the SMD. The housing includes four registration fingers at its corners that mate with the registration holes on the circuit board. The lower rim of the housing presses the pins of the SMD against the trace pad. A spring retaining clip locks the housing in position. The clip includes four pairs of locking hooks at its corners that are inserted through slots at the corners of the housing. The tips of the hooks extend through the registration fingers and lock themselves against the lower rims of the registration holes. The clip includes concave springs on each side that exert pressure against the housing, so as to ensure the pins of the SMD are pressed tightly against the trace pad for reliable electrical contact. The housing and the spring clip are not installed if the SMD is not to be installed during circuit board manufacturing, so that manufacturing cost is minimized. The SMD, the housing, and the spring clip are easily user installable when necessary in the field.

Figure 1:
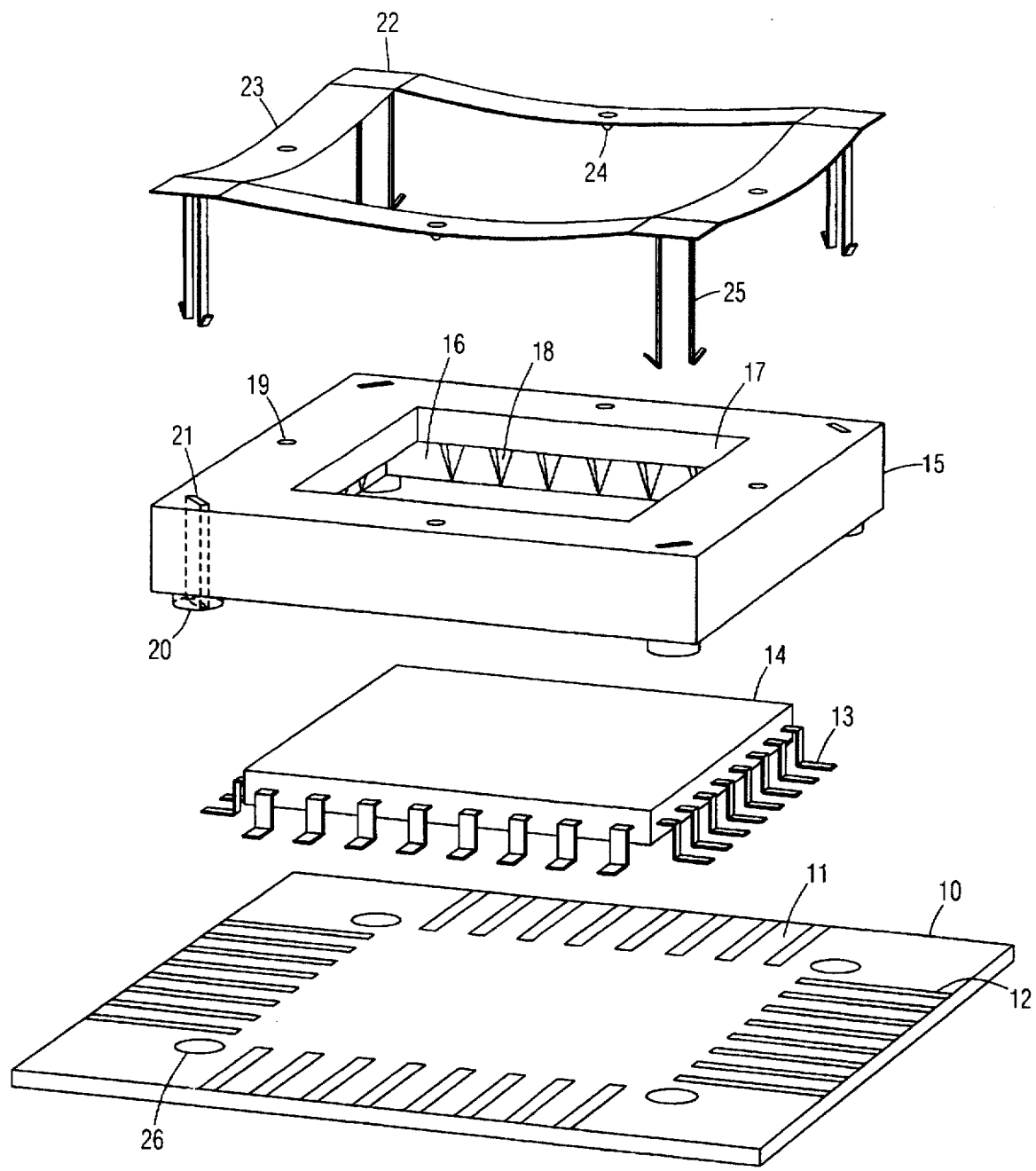
FIG. 1 is a top perspective exploded view of a clip-on IC retaining apparatus in accordance with a preferred embodiment of the invention.

| DRAWING REFERENCE NUMERALS | | | |
|---|---|---|---|
| 10. | Circuit Board | 11. | Trace Pad |
| 12. | Traces | 13. | Pins |
| 14. | SMD | 15. | Hosing |
| 16. | Cavity | 17. | Overhang |
| 18. | Ribs | 19. | Notches |
| 20. | Registration Fingers | 21. | Slot |
| 22. | Retaining Clip | 23. | Springs |
| 24. | Nubs | 25. | Hooks |
| 26. | Registration Holes | | |

DETAILED DESCRIPTION OF THE INVENTION

FIG. 1:

In accordance with a preferred embodiment of the invention shown in the top perspective exploded view in FIG. 1, a clip-on IC retaining apparatus includes a circuit board 10 with a rectangular trace pad 11 having traces 12. Traces 12 are arranged for mating with pins 13 of a conventional, rectangular IC (integrated circuit), specifically a SMD (Surface Mount Device) 14.

A housing 15, preferably made of rigid plastic, includes a cavity 16 open to its lower side for securely receiving SMD 14. In this example, housing 15 and cavity 16 are rectangular for matching the shape of SMD 14, but they may be of any other shape for mating with SMDs of other shapes.

Housing 15 includes an overhang 17 for engaging the top of SMD 14. Vertical ribs 18 are arranged along the vertical walls of cavity 16 for separating and aligning any bent pins 13. Each rib 18 is tapered from top to bottom for facilitating sliding between adjacent pins 13. A detent 19 is arranged on top of housing 15 along each side edge thereof. A registration finger 20 projects downwardly from each corner of housing 15 for mating with a corresponding registration hole 26 arranged at a corner of trace pad 1 1 on circuit board 10. A vertical slot 21 extends between the top side of housing 15 at each corner thereof and the lower end of a corresponding registration finger 20. A spring retaining clip 22 includes elongated concave flat springs 23 connected in a rectangular pattern. An alignment nub 24 projects downwardly medially from each flat spring 23 for mating with a corresponding detent 19. A pair of opposite spring hooks 25 extends downwardly from each corner of retaining clip 22 for being inserted through a corresponding slot 21.

Figure 2:
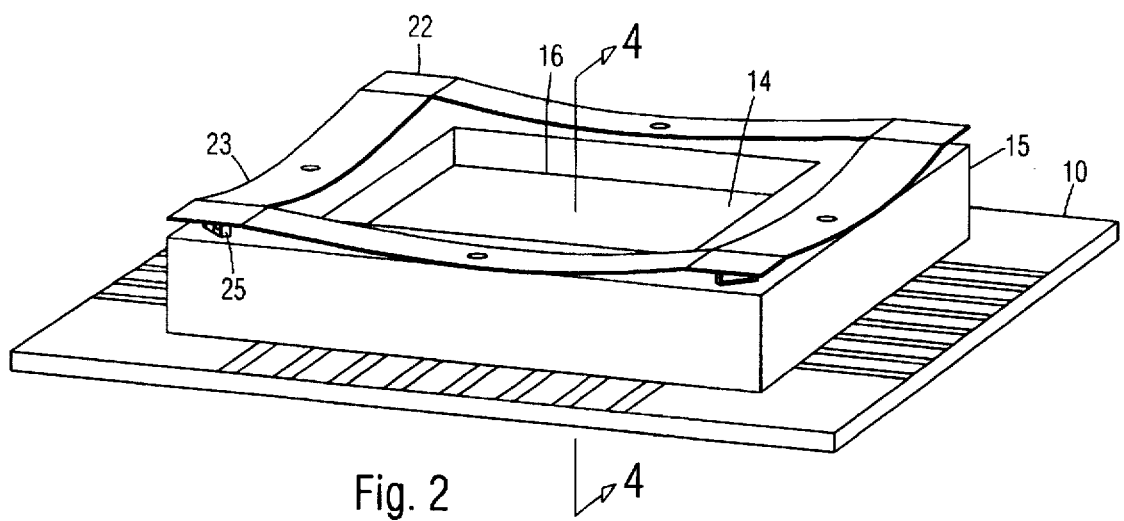
FIG. 2 is a top perspective view of the clip-on IC retaining apparatus when assembled.
Figure 3:
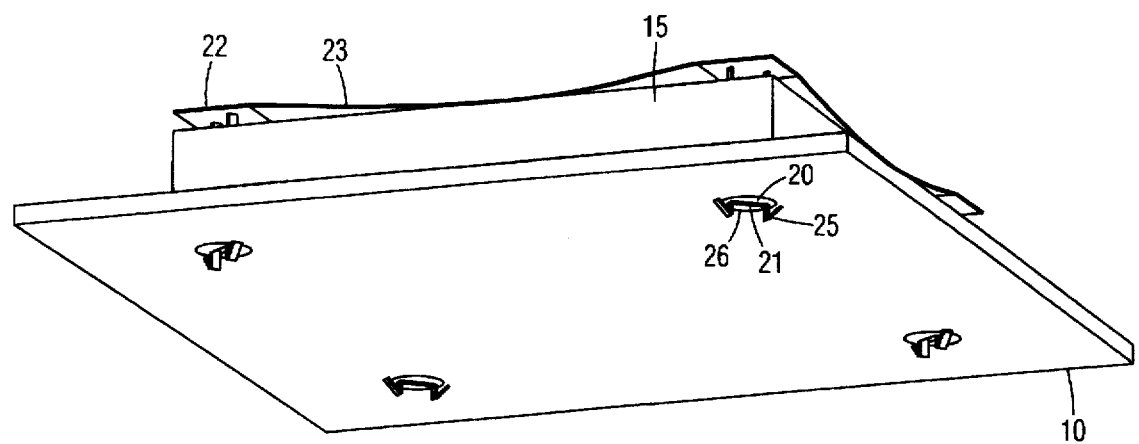
FIG. 3 is a bottom perspective view of the clip-on IC retaining apparatus when assembled.

FIGS. 2 and 3:

The clip-on IC retaining apparatus is shown assembled in top and bottom perspective views in FIGS. 2 and 3, respectively. SMD 14 is received in cavity 16. Housing 15 is positioned on circuit board 10, with all registration fingers 20 inserted through registration holes 26. Hooks 25 are positioned within slots 21, and their distal ends are locked against the bottom rims of registration holes 26. Downwardly bowing springs 23 exert pressure upon housing 15 to press it tightly against circuit board 10.

FIG. 4

Figure 4:
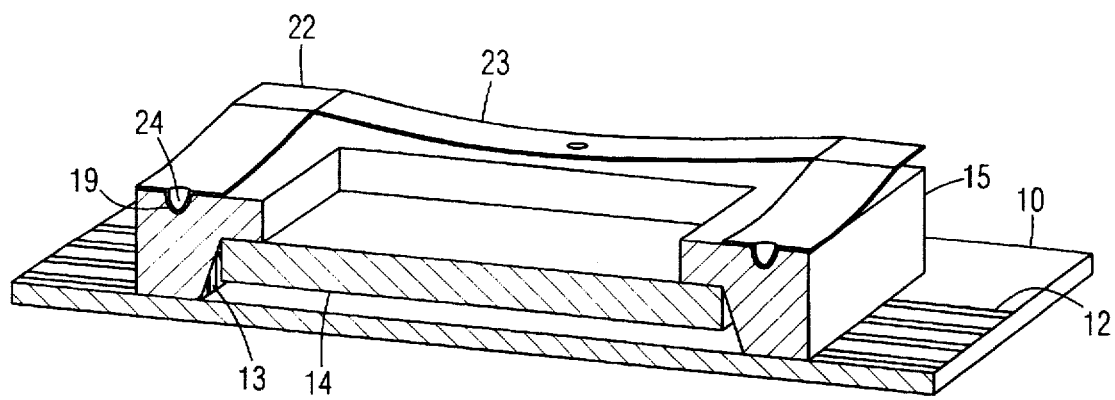
FIG. 4 is a perspective sectional view of the assembled clip-on IC retaining apparatus, taken along line 4—4 in FIG. 2.

The clip-on IC retaining apparatus is shown assembled in a perspective sectional view in FIG. 4. Alignment nubs 24 are positioned in detents 19 to prevent springs 23 from sliding sideways. Rigid housing 15 distributes the pressure from springs 23 evenly onto the horizontal portions (not shown) of pins 13, which are tightly pressed against traces 12 for making reliable electrical contact.

FIG. 5

Figure 5:
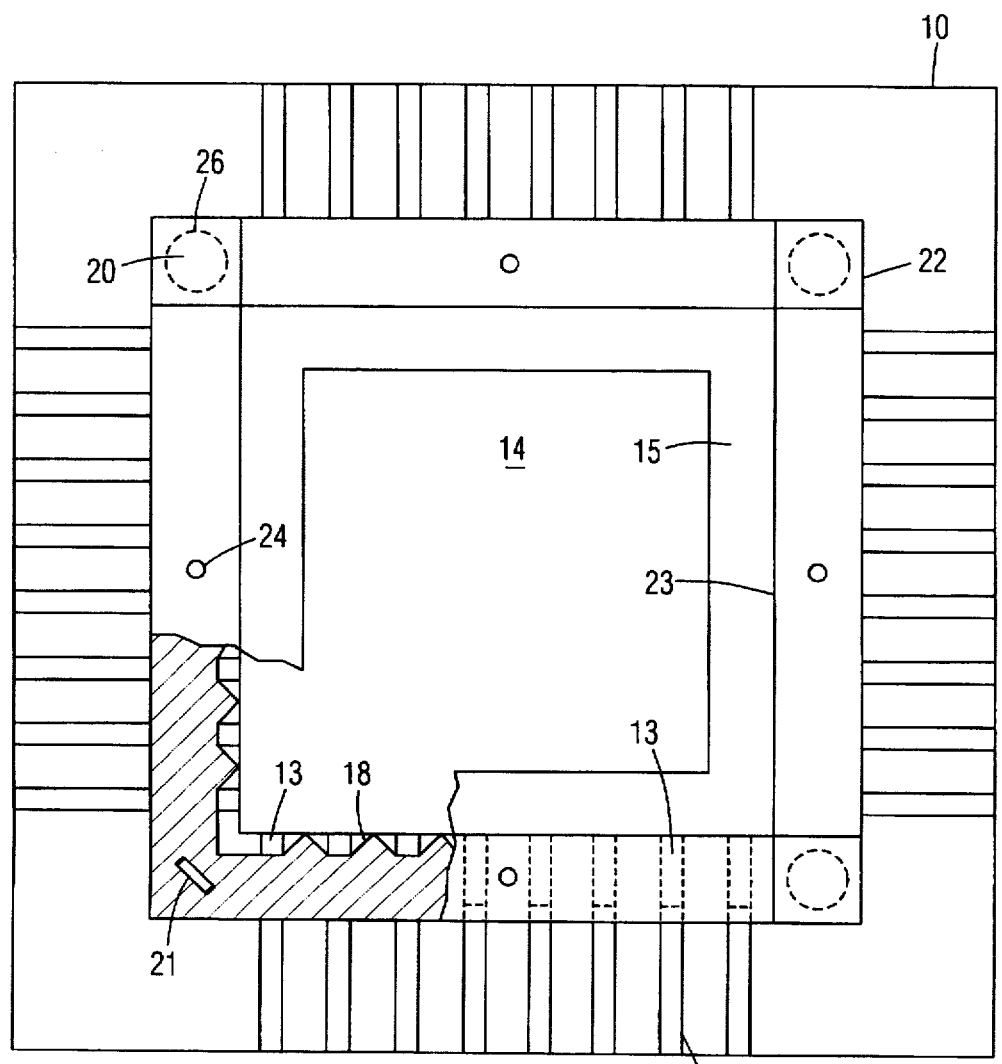
FIG. 5 is a partial cutaway top view of the assembled clip-on IC retaining apparatus.

The clip-on IC retaining apparatus is shown in a partial cutaway top view in FIG. 5. When housing 15 is positioned on SMD 14, tapered ribs 18 are automatically positioned between pins 13, so that SMD 14 is precisely located within housing 15. If some pins 13 are improperly spaced before installation, ribs 18 will slide between them and force them into position. When housing 15 is positioned on circuit board 10 so that registration fingers 20 are positioned in registration holes 26, pins 13 are precisely aligned with traces 12.

SUMMARY AND SCOPE

Accordingly, I have provided a clip-on IC retaining apparatus that retains an IC on a circuit board without solder. It is easily field installable by a user as necessary after the manufacturing process. It eliminates the need to manufacture circuit boards with empty sockets, which are often wasted. It includes no metal pins, so that it is less expensive to manufacture, and it does not increase capacitance or inductance loads.

Although the above descriptions are specific, they should not be considered as limitations on the scope of the invention, but only as examples of the embodiments. Many substitutes and variations are possible within the teachings of the invention. For example, instead of having an open top, the housing may have a closed top, in which case the entire top comprises the overhang. The housing may be triangular, circular, or other shapes for receiving ICs of different shapes. The housing may be adapted to receive ICs with two rows of pins extending from opposite sides. The number of registration fingers and registration holes may be reduced from four to two without affecting registration accuracy; the pair of fingers and holes preferably being arranged at diagonal corners of the IC and trace pad. Instead of a separate retaining clip, the registration fingers on the housing may incorporate spring hooks or circumferential locking ribs for locking themselves within the register holes. Therefore, the scope of the invention should be determined by the appended claims and their legal equivalents, not by the examples given.

I claim:

1. An IC retaining apparatus for retaining a rectangular IC having a plurality of pins extending from at least two opposite sides thereof, comprising:

a circuit board having a rectangular trace pad with a plurality of traces;

four registration holes arranged on said circuit board at four corners of said trace pad;

a housing having an open rectangular cavity on a bottom side thereof, said cavity having four vertical walls, said cavity being adapted for securely receiving said IC therein;

four registration fingers projecting downwardly from a bottom side of said housing at four corners thereof, said registration fingers mating with said registration holes on said circuit board for precisely positioning said pins in contact and registration with said traces of said trace pad;

four slots positioned at said four corners of said housing, each of said slots extending vertically between a top side of said housing and a lower end of a corresponding registration finger; and a retaining clip positioned on said top side of said housing, said retaining clip comprising four downwardly curved flat springs connected in a rectangular pattern, and four hooks extending downwardly from four corners of said retaining clip, each of said hooks extending through a corresponding slot in said housing, each of said hooks extending out said lower end of a corresponding registration finger, a tip of each of said hooks engaging a bottom rim of a corresponding registration hole so as to retain said housing on said circuit board.

2. The IC retaining apparatus of claim 1, wherein a lower edge of said cavity is for engaging and pressing said pins against said traces.

3. The IC retaining apparatus of claim 1, further including a plurality of vertical ribs arranged on at least two of said vertical walls of said cavity, said ribs for positioning between said pins for separating and aligning said pins with said traces.

4. The IC retaining apparatus of claim 3, wherein said ribs are each tapered from top to bottom for facilitating sliding between said pins.

5. The IC retaining apparatus of claim 1, further including a nub projecting from a bottom side of each of said flat springs, said nub engaging a notch arranged on said top side of said housing adjacent a corresponding side edge thereof to facilitate lateral location of a corresponding flat spring on said housing.

6. An IC retaining apparatus for retaining an IC on a circuit board having a trace pad with a plurality of traces, said circuit board further including a plurality of registration holes adjacent said trace pad, said IC including a plurality of pins extending from side edges thereof, said IC retaining apparatus comprising:

a housing with an open cavity on a bottom side thereof for securely receiving said IC therein;

a plurality of registration fingers projecting downwardly from said housing for mating with said registration holes on said circuit board for precisely positioning said pins in contact and registration with said traces of said trace pad; and a plurality of vertical ribs arranged on vertical walls of said cavity for positioning between said pins for separating and aligning said pins with said traces, each of said ribs including a tapered lower end, and is further tapered from an inner end to an outer end in a horizontal direction for facilitating sliding between said pins.

* * * * *